United States Patent
Kobayashi et al.

[11] Patent Number: 5,838,031
[45] Date of Patent: Nov. 17, 1998

[54] LOW NOISE-HIGH LINEARITY HEMT-HBT COMPOSITE

[75] Inventors: Kevin Wesley Kobayashi, Torrance; Dwight Christopher Streit, Seal Beach; Aaron Kenji Oki, Torrance; Donald Katsu Umemto, Manhattan Beach, all of Calif.

[73] Assignee: TRW Inc., Redondo Beach, Calif.

[21] Appl. No.: 611,265

[22] Filed: Mar. 5, 1996

[51] Int. Cl.[6] .......................... H01L 31/0328; H01P 3/08
[52] U.S. Cl. .................... 257/197; 257/275; 257/728; 333/246
[58] Field of Search ................... 257/197, 195, 257/69, 204, 206, 338, 350, 351, 357, 270, 358, 359, 365, 366, 377, 213, 275, 728; 333/246, 247; 437/22, 24

[56] References Cited

U.S. PATENT DOCUMENTS

| | | |
|---|---|---|
| 4,553,108 | 11/1985 | Young . |
| 5,086,282 | 2/1992 | Aina et al. . |
| 5,166,083 | 11/1992 | Bayraktaroglu .................. 257/197 |
| 5,213,987 | 5/1993 | Bayraktaroglu .................. 437/24 |
| 5,272,366 | 12/1993 | Sei et al. ....................... 257/206 |
| 5,312,765 | 5/1994 | Kanaber ........................ 437/22 |
| 5,378,941 | 1/1995 | Nishio et al. .................. 257/204 |
| 5,387,880 | 2/1995 | Kobayashi . |
| 5,398,004 | 3/1995 | Kobayashi . |
| 5,401,999 | 3/1995 | Bayraktaroglu .................. 257/458 |
| 5,422,501 | 6/1995 | Bayraktaroglu .................. 257/197 |
| 5,528,769 | 6/1996 | Berenz et al. . |
| 5,532,650 | 7/1996 | Igarashi . |

FOREIGN PATENT DOCUMENTS 0710984 8/1996 European Pat. Off. .
0643496 3/1995 Germany .

OTHER PUBLICATIONS

K. W. Kobayashi, et al., "A Monolithic HEMT–HBT Direct Couplded Amplifier with Active Input Matching," IEEE Microwave and Guided Wave Letters, vol. 6, No. 1, Jan. 1996, New York, pp. 55–57.

K. W. Chang, et al., "A V–Band Monolithic InP HEMT Downconverter," IEE GaAs IC Symposium, Oct. 10, 1993, pp. 211–214.

K. W. Kobayashi, et al., "A Novel Monolithic LNA Integrating a Common–Source HEMT with an HBT Darlington Amplifier," IEEE Microwave and Guided Wave Letters, vol. 5, No. 12, Dec. 1995, pp. 442–444.

Stroit et al., "Monolithic HEMT–HBT Integration by Selective MBE," IEEE Transactions on Electron Devices, vol. 42, No. 4, Apr. 1995, pp. 618–623.

Stroit et al., "A Monolithic HBT–Regulated HEMT LNA by Selective MBE," IEEE Microwave and Guided Wave Letters, vol. 5, No. 4, Apr. 1995, pp. 124–126.

Primary Examiner—Carl W. Whitehead, Jr.
Attorney, Agent, or Firm—Michael S. Yatsko

[57] ABSTRACT

4-terminal HEMT-HBT composite devices, based upon monolithically integrated HEMT-HBT technology and configured in various topologies, are useful in a wide range of applications which currently utilize discrete MMICs. In particular, the 4-terminal topologies are easily configured as 3-terminal composite devices useful in various 2-port and 3-port MMIC circuit applications, such as low noise-high linearity amplifiers as well as mixers, which provide the benefits of a reduction in size, as well as corresponding cost while providing better performance than utilizing either HEMT or HBT devices individually.

33 Claims, 8 Drawing Sheets

LOW NOISE-HIGH LINEARITY HEMT-HBT COMPOSITE

BACKGROUND OF THE INVENTION

1. Field of the Invention

The present invention relates to monolithic microwave integrated circuits (MMICs) and more particularly to low noise-high linearity MMICs formed from monolithically integrated high-electron mobility transistor (HEMT) and heterojunction bipolar transistor (HBT) devices configured in various topologies, useful in a wide range of applications, which reduce the size, cost, as well as power consumption of such applications while providing relatively better overall performance capability than utilizing either HEMT or HBT devices individually.

2. Description of the Prior Art

Various applications are known in which low noise and high linearity performance are required. Examples of such applications include low noise amplifiers (LNAs), variable gain amplifiers (VGAs), transmit/receive (T/R) modules, power amplifiers, transimpedance amplifiers and optical receivers used in various products including wireless products, cellular telephony, fiber optic data links, portable electronics and the like. In many of such applications, it is known to utilize a high-electron mobility transistor (HEMT) for its low-noise figure performance and a heterojunction bipolar transistor (HBT) for its high-linearity performance. Because of the limited topologies available in known monolithic microwave integrated circuits (MMICs), oftentimes, separate MMICs are used. In certain applications, for example, in applications where there are space constraints, the use of multiple MMICs is undesirable. In addition, the use of multiple MMICs increases the cost as well as the complexity and power consumption of the system in which such devices are used.

MMICs have been developed in which HEMT and HBT technologies have been monolithically integrated in a single MMIC, for example, as disclosed in copending U.S. patent application Ser. No. 08/333,538, filed Nov. 2, 1994, hereby incorporated by reference. However, the topologies of such integrated HEMT-HBT MMICs are limited. While such MMICs are useful in certain applications, many applications as discussed above require different circuit configurations and thus in such applications, separate HEMT and HBT MMICs are used. As discussed above, the use of multiple MMICs increases the cost, as well as the complexity of the circuitry and is relatively limited in applications having size constraints.

SUMMARY OF THE INVENTION

It is an object of the present invention to solve various problems in the prior art.

It is yet another object of the present invention to provide microwave monolithic integrated circuits (MMICs) with integrated HEMT-HBT devices configured in various topologies that are useful in a wide range of applications.

Briefly, the present invention relates to a 4-terminal MMIC formed from monolithically integrated HEMT-HBT technology in various topologies useful in a wide range of applications which currently utilize multiple discrete MMICs. In particular, the 4-terminal topologies are easily configured as 3-terminal devices by grounding one of the terminals. The 3-terminal devices can easily be configured in various two-port and three-port configurations useful in various applications in which multiple MMICs are known to be used, such as low noise-high linearity amplifiers as well as mixers, which provide the benefits of a reduction in size, cost, as well as lower power consumption while providing better performance than either HEMT or HBT devices individually.

BRIEF DESCRIPTION OF THE DRAWING

These and other advantages of the present invention will become apparent with reference to the following specification and attached drawing, wherein.

DETAILED DESCRIPTION OF THE INVENTION

As mentioned above, low noise and high linearity performance is required in a relatively wide range of applications.

In order to achieve such performance objectives, high-electron mobility transistors (HEMTs) and heterojunction bipolar transistor (HBT) devices are known to be used for such applications. Other than a relatively few topologies formed as monolithic microwave integrated circuits (MMIC) in which the HEMT and HBT technologies are integrated, many known low noise and high linearity performance applications are known to use separate HEMT and HBT MMICs. The present invention provides HEMT-HBT composite device topologies that combine key performance and device properties in order to provide advantages in size, performance and circuit functionality.

The performance capabilities of the HEMT device technology, HBT device technology and composite HEMT-HBT devices in accordance with the present invention is illustrated in Table 1.

TABLE 1

| Device & Technology | Noise Figure | IP3 (Linearity) | Power Efficiency | Frequency Capability |
|---|---|---|---|---|
| HBT | High | Medium | High | High dc->20 GHz |
| HEMT | High Gm | Low | Medium | Medium dc->100 GHz |
| HEMT-HBT Composite devices (general) | Very High ≈ $Gm_{hemt}$* $Gm_{hbt}$ | Low | High | High dc->20 GHz |
| HEMT-HBT Topology (FIG. 2) CG-CE | Very High ≈ $Gm_{hemt}$* $Gm_{hbt}$ | Medium | High | High dc->20 GHz |
| HEMT-HBT Topology (FIG. 4) CS-CE | Very High ≈ $Gm_{hemt}$* $Gm_{hbt}$ | Low | High | High dc->20 GHz |
| HEMT-HBT Topology (FIG. 6) CS-CB | High ≈ $Gm_{hemt}$ | Low | High | High dc->20 GHz |

As illustrated in Table 1, the overall capability of the HEMT-HBT composite devices in accordance with the present invention provide a combination of low noise and high linearity characteristics, which cannot be obtained from either the HEMT or HBT devices alone. In addition, the HEMT-HBT monolithic composite devices can provide better performance than obtainable from an equivalent discrete hybrid (MIC) implementation of the same composite device topologies.

Figure 1A:
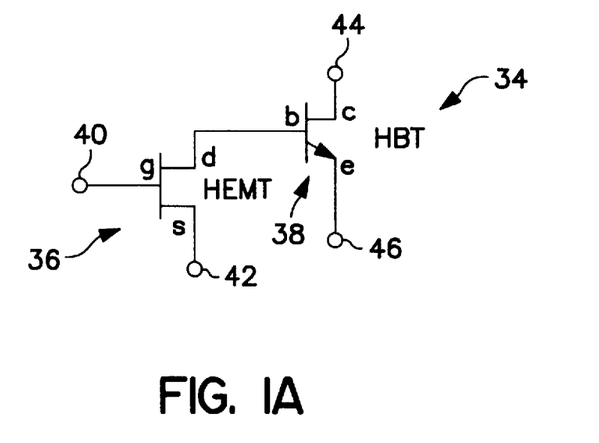
FIGS. 1a–1b are schematic representations of two HEMT-HBT 4-terminal composite devices illustrating two topologies in accordance with the present invention.
Figure 1B:
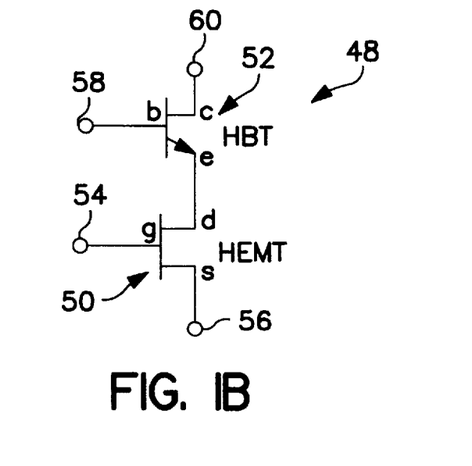

The topologies for the composite HEMT-HBT devices in accordance with the present invention are illustrated in FIGS. 1a and 1b. As shown, each of the two topologies is configured as a 4-terminal device and includes a low noise HEMT device that is directly coupled to a high linearity HBT device. Each of the terminals are defined by an open circle. By directly coupling the HEMT and HBT, the composite devices will maintain low noise figure characteristics of the HEMT and the high linearity characteristics of the HBT. In order to provide a relatively wide range of applications, each of the topologies are configured with four terminals to enable the topologies to apply in a relatively wide range of circuit applications, including various amplifiers and mixers as discussed below.

The two 4-terminal topologies are shown with electrical coupling to terminals for connection to external circuits. These terminals are defined by an open circle. As discussed below, one of the terminals can be grounded and eliminated to form 3-terminal devices and 2-port and 3-port circuit networks as discussed below.

The first topology is generally identified with the reference numeral 34. The composite device 34 includes a HEMT 36 and an HBT 38. In the composite device 34, the drain electrode of the HEMT is directly connected to the base electrode of the HBT 38. The gate and source electrodes of the HEMT 36 are connected to external terminals 40 and 42, while the collector and emitter electrodes of the HBT 38 are connected to external terminals 44 and 46, respectively.

A second 4-terminal topology of a composite HEMT-HBT device is illustrated in FIG. 1b and generally identified with the reference numeral 48. The composite device 48 includes a HEMT 50 and an HBT 52. In this topology, the drain electrode of the HEMT 50 is directly connected to the emitter electrode of the HBT 52. The gate and source electrodes of the HEMT 50 are connected to external terminals 54 and 56, respectively, while the base and collector electrodes of the HBT 52 are connected to external terminals 58 and 60, respectively, to form the 4-terminal HEMT-HBT composite device 48.

Figure 2:
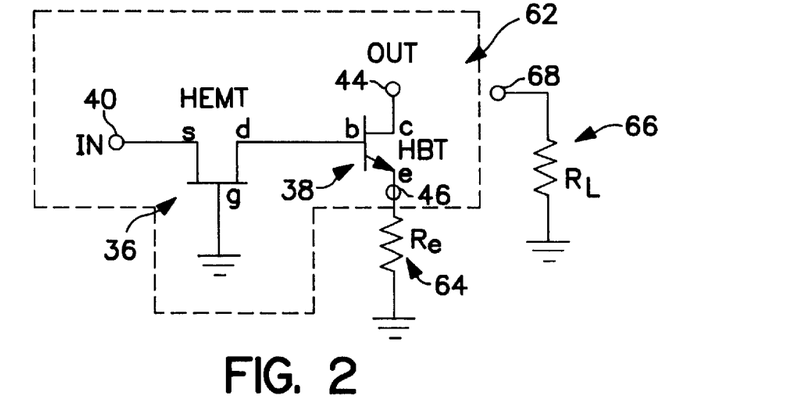
FIG. 2 is a schematic representation of a low noise-high linearity HEMT common-gate HBT common-emitter 3-terminal composite device in accordance with the present invention.

As shown in FIGS. 2–7, the 4-terminal topologies, illustrated in FIGS. 1a and 1b, can be configured as 3-terminal devices which can be used as a basis for various useful 2- and 3-port circuit configurations. For example, the composite HEMT-HBT device 34, illustrated in FIG. 1a, can be converted into a useful 3-terminal device configured as a 2-port circuit 62 for low noise-high linearity amplification applications. In this application like reference numerals are used to identify like components and open circles are used to define the composite device terminals. As shown in FIG. 2, the external terminal 40, connected to the source electrode of the HEMT 36, is used as an input terminal, while the external terminal 44, connected to the collector electrode of the HBT 38, is used as an output terminal. The emitter electrode of the HBT 38 is the third terminal as defined by the open circle. In the composite HEMT-HBT device 62, illustrated in FIG. 2, the external terminal 42 of the 4-terminal device defined in FIG. 1a from the gate electrode of the HEMT 36 is grounded and thereby eliminated to form a 3-terminal composite device configuration. In order to provide a useful 2-port circuit configuration for use in low noise-high linearity amplification applications, the emitter electrode of the HBT 38 is connected to ground by way of an external emitter resistor 64. An external load resistor $R_L$ 66 may be connected between ground and an external terminal 68 to define a load impedance for the 2-port output. The low noise-high linearity HEMT common-gate HBT common-emitter 3-terminal composite device is thus used to construct a 2-port low noise-high linearity amplifier 62.

Figure 3:
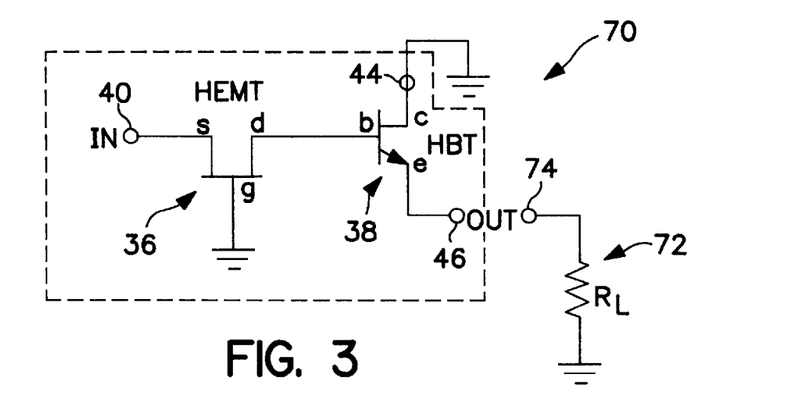
FIG. 3 is a schematic diagram of a low noise-high linearity HEMT common-gate HBT common-collector 3-terminal composite device in accordance with the present invention.

The HEMT-HBT topology, illustrated in FIG. 1a, can also be configured as a useful 3-terminal device employed in a 2-port low noise-high linearity circuit 70 as illustrated in FIG. 3. In the 2-port circuit 70, the gate electrode of the HEMT 36 is connected to ground. The collector electrode of the HBT 38 is defined as a terminal 44 of the 3-terminal composite device and is designated with an open circle. In order to provide a useful configuration for low noise-high linearity amplifiers applications, an external load resistor $R_L$ 72 may be connected between ground and an output terminal 74 to define a load impedance at the output of the amplifier. The emitter electrode of the HBT 38, connected to the terminal 46, defines the output of the device to form a low noise-high linearity HEMT common-gate HBT common-collector 3-terminal composite device whereby the collector of the HBT 38 is the third terminal and is coupled to ground to form a useful 2-port amplifier.

An important aspect of the 2-port amplifier circuit configurations, illustrated in FIGS. 2 and 3, is that a relatively low noise common-gate HEMT may be used to actively match the input of the amplifier without the use of a relatively large area consuming microstrip or lumped element components. As such, the composite devices 62 and 70 can be directly coupled to an external circuit. By implementing the HBT 24 in a common-emitter configuration, the composite device 62, illustrated in FIG. 2 will have a relatively large transconductance and high-output impedance, useful for high voltage gain applications using feedback topologies.

The composite device 70, illustrated in FIG. 3, is configured as a HEMT common-gate HBT common-collector device. By employing the HBT in a common-collector configuration, the resulting HEMT-HBT composite device will have a relatively low output impedance and thus be suitable for driving low impedance systems. In both of the amplifier configurations illustrated in FIGS. 2 and 3, a common-gate HEMT input device allows the noise figure or input return-loss to be electronically tuned, for example, as disclosed in "A Monolithic HEMT-HBT Direct Coupled Amplifier with Active Input Match," by K. W. Kobayashi, D. C. Streit, D. K. Umemoto, T. R. Block and A. K. Oki, *IEEE Microwave & Guided-Wave Letters*, Vol. 6, No. 1, January 1996, pp. 55–57, hereby incorporated by reference.

The effective transconductance of the common-emitter HBT composite device 62, illustrated in FIG. 2, is given in equation (1):

$$Gm_{eff} \approx \left\{ \frac{Gm_{HEMT}}{1+Gm_{HEMT}*r_s} * r_{ds} \right\} \left\{ \frac{\alpha_0}{\frac{r_b}{\beta_0+1} + \frac{1}{Gm_{HBT}} + r_e + R_e} \right\} \quad (1)$$

where $Gm_{HEMT}$ is the DC transconductance, $r_s$ is the parasitic source resistance, $r_{ds}$ is the DC output resistance, $R_e$ is the external emitter resistance, $r_e$ is the dynamic emitter resistance, $r_b$ is the base resistance, $\alpha_0$ is the current gain from emitter to collector, $\beta_0$ is low-frequency forward current gain, and $Gm_{HBT}$ is the DC transconductance of the HBT.

The input impedance $Z_{in}$ of the device 62 is provided by equation (2):

$$Z_{in}(s) \approx rs + \frac{1}{Gm_{HEMT}} \quad (2)$$

The output impedance $Z_{out}$ of the device 62 is provided by equation (3):

$$Z_{out}(s) \approx r_0 * \left( 1 + \frac{Gm_{HBT}}{1+Gm_{HBT}*r_e} \right) \quad (3)$$

where $$Gm_{HBT} + \frac{I_c*q}{n*KT} \text{ and } \alpha_0 = \frac{\beta_0}{1+\beta_0}$$

where $r_0$ is output resistance, $I_c$ is the collector current, q is electronic charge, n is the ideality factor, K is Bortzmann's constant, and T is temperature in degrees kelvin.

The effective transconductance for the HEMT common-gate HBT common-collector device 70, illustrated in FIG. 3, is given by equation (4):

$$Gm_{eff} \approx \left\{ \frac{Gm_{HEMT}}{1+Gm_{HEMT}*r_s} * r_{ds} \right\} \left\{ \frac{1}{\frac{r_b}{\beta_0+1} + \frac{1}{Gm_{HBT}} + r_e + R_L} \right\} \quad (4)$$

The input impedance of the HEMT common-gate HBT common-collector 3-terminal composite device 70 is given in equation (5):

$$Z_{in}(s) \approx r_s + \frac{1}{Gm_{HEMT}} \quad (5)$$

while the output impedance of the device 70 is given in equation (6):

$$Z_{out}(s) \approx \left( r_e + \frac{1}{Gm_{HBT}} + \frac{r_b + r_{ds}}{\beta_0+1} \right) \quad (6)$$

Figure 4:
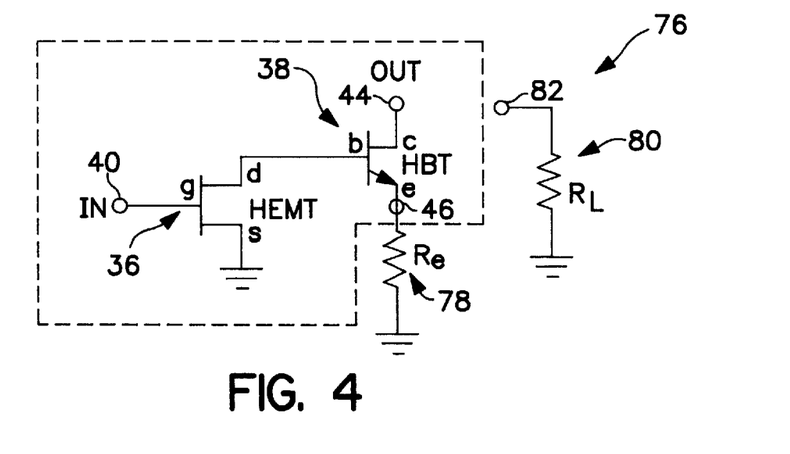
FIG. 4 is a schematic diagram of a low noise-high linearity HEMT common-source HBT common-emitter 3-terminal composite device in accordance with the present invention.
Figure 5:
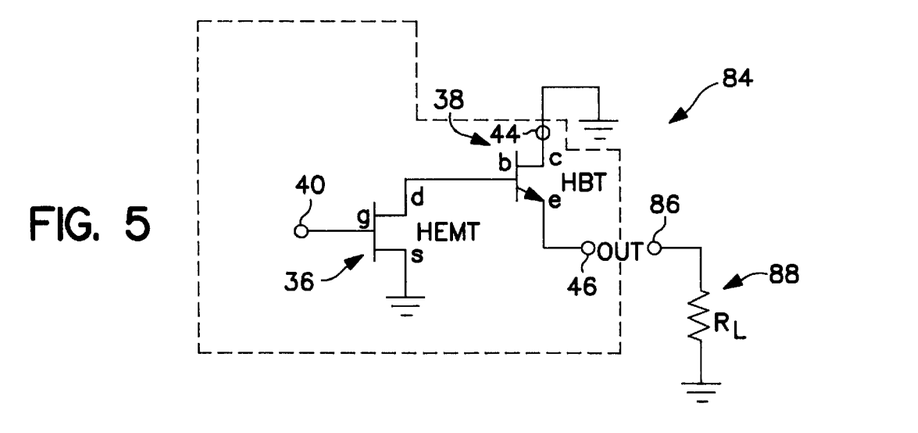
FIG. 5 is a schematic diagram of a low noise-high linearity HEMT common-source HBT common-collector 3-terminal composite device in accordance with the present invention.

The topology illustrated in FIG. 1a for the HEMT-HBT 4-terminal composite device 34 can be configured into two different 3-terminal devices, which can also be used for low noise-high linearity amplification, for example as shown in FIGS. 4 and 5. An important aspect of the 3-terminal devices configured in 2-port amplifier configurations, illustrated in FIGS. 4 and 5, is that the relatively low noise common-source HEMT provides a high input impedance, which allows for the construction of low loss matching networks for tuning the input transistor for noise and bandwidth, for example in a distributed amplifier topology. With reference to FIGS. 4 and 5, like reference numerals are used to describe components having similar functions relative to the composite device 34 illustrated in FIG. 1a.

Referring to FIG. 4, a low noise HEMT common-source HBT common-emitter composite device whose terminals are defined by the open circles is employed as a 2-port amplifier 76. In this application, the source electrode of the HEMT 36 is connected to ground. The emitter electrode, defined as one of the 3-terminals of the composite device topology, is grounded by way of an external emitter resistor $r_e$ 78 in order to provide a useful 2-port circuit configuration for low noise-high linearity amplifiers. The HEMT common-source configuration where the source electrode is grounded enables the output terminal 42 shown in FIG. 1b, to be eliminated. An external load resistor $R_L$ 80 may be connected between ground and an output terminal 82 to define a load impedance at the output of the amplifier. The configuration of the HEMT-HBT 2-port amplifier as illustrated in FIG. 4 provides optimum noise figure performance in conjunction with a high-linearity HBT common emitter output.

The topology illustrated in FIG. 1a may also be used to form a HEMT common-source HBT common-collector low noise-high linearity composite device 84, illustrated in FIG. 5. In this application the source electrode of the HEMT 36 is connected to ground, thus eliminating terminal 42, illustrated in FIG. 1a. In the composite device 84, the collector electrode of the HBT 38, connected to terminal 44 of the composite device, may also be connected to ground externally. In order to provide a useful configuration, a load resistor $R_L$ 88 may be connected between an external terminal 86 and ground to define an output load impedance for the resulting HEMT-HBT 2-port network 84.

An important aspect of the 3-terminal composite device configurations, illustrated in FIGS. 4 and 5, is that a low noise common-source HEMT provides a high-input impedance, useful in low loss matching networks to tune the input transistor for noise and bandwidth, such as in a distributed amplifier topology. In particular, a common-source HEMT input provides the best noise figure performance. The high-input impedance also allows optimal use of parallel feedback to the gate input, as well as for transimpedance amplifier applications that require a relatively high input impedance. By implementing the HBT 38 in a common-emitter configuration, the composite device 76, illustrated in FIG. 4, will have a relatively large transconductance and a relatively high output impedance, useful for high voltage gain applications using feedback topologies.

The common-collector configuration for the HBT 38 and the HEMT-HBT composite 3-port composite device 84, illustrated in FIG. 5, provides for a relatively low output impedance, thus can be used to efficiently drive relatively low impedance systems.

The effective transconductance of the HEMT common-source HBT common-emitter 3-terminal composite device as defined in a 2-port network 76 with one terminal coupled to ground, illustrated in FIG. 4, is given in equation (7) below:

$$Gm_{eff} \approx \left\{ \frac{Gm_{HEMT}}{1 + Gm_{HEMT} * r_s} * r_{ds} \right\} \left\{ \frac{\alpha_0}{\frac{r_b}{\beta_0 + 1} + \frac{1}{Gm_{HBT}} + r_e + R_e} \right\} \quad (7)$$

The input and output impedance of the composite device 76, illustrated in FIG. 4, is given by equations (8) and (9):

$$Z_{in}(s) \approx r_g + r_s + r_i + \frac{1}{s * C_{gs}} \quad (8)$$

$$Z_{out}(s) \approx r_0 * \left( 1 + \frac{Gm_{HBT}}{1 + Gm_{HBT} * r_e} \right) \quad (9)$$

where $$Gm_{HBT} = \frac{I_c * q}{n * KT} \text{ and } \alpha_0 = \frac{\beta_0}{1 + \beta_0}$$

The transconductance for the HEMT common-source HBT common-collector 3-terminal composite device as defined in a 2-port network with one of its terminals coupled to ground, illustrated in FIG. 5, is given in equation (10):

$$Gm_{eff} \approx \quad (10)$$

$$\left\{ \frac{Gm_{HEMT}}{1 + Gm_{HEMT} * r_s} * r_{ds} \right\} \left\{ \frac{1}{\frac{r_b}{\beta_0 + 1} + \frac{1}{Gm_{HBT}} + r_e + R_L} \right\}$$

The input and output impedance of the composite device 84, illustrated in FIG. 5, is provided in equations (11) and (12) below:

$$Z_{in}(s) \approx r_g + r_s + r_i + \frac{1}{s * C_{gs}} \quad (11)$$

$$Z_{out}(s) \approx \left( r_e + \frac{1}{Gm_{HBT}} + \frac{r_b + r_{ds}}{\beta_0 + 1} \right) \quad (12)$$

Figure 6:
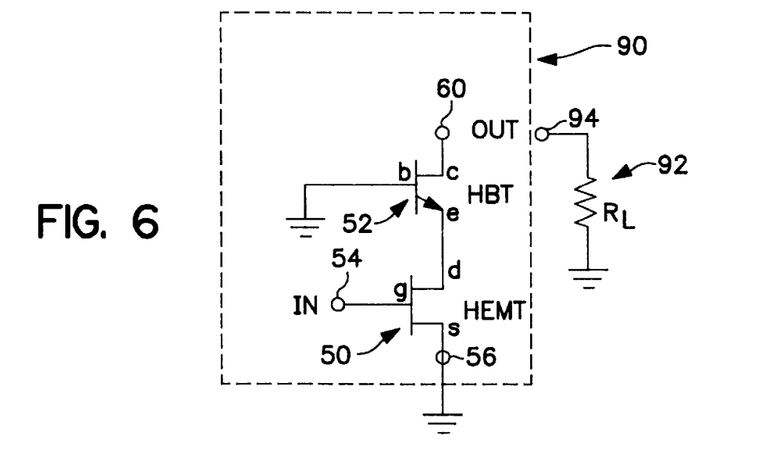
FIG. 6 is a schematic diagram of a low noise-high linearity HEMT common-source HBT common-base 3-terminal composite device in accordance with the present invention.
Figure 7:
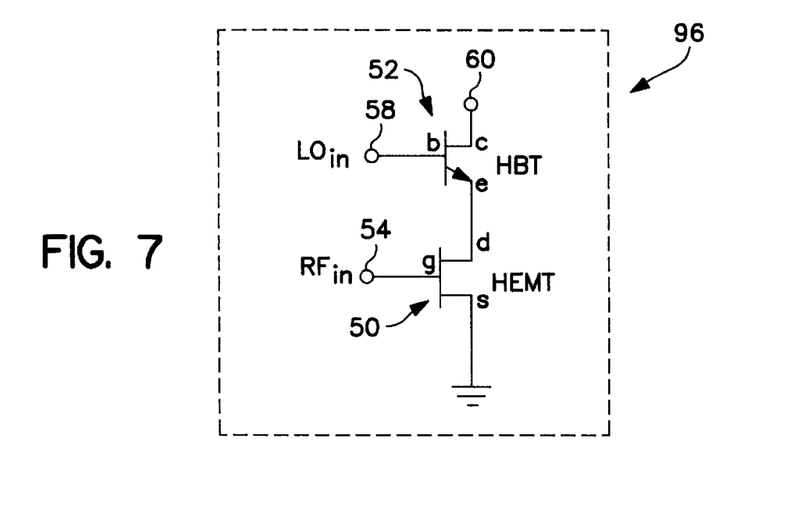
FIG. 7 is a schematic diagram of a low noise-high linearity HEMT common-source HBT 3-terminal mixer device in accordance with the present invention.

The 4-terminal HEMT-HBT topology 48, illustrated in FIG. 1b, can also be configured into 3-terminal composite devices, which can be used for 2-port low noise-high linearity amplifiers or 3-port mixer applications as illustrated in FIGS. 6 and 7, respectively. Using like reference numerals for components with similar function, the HEMT-HBT composite device, illustrated in FIG. 6, generally identified with the reference numeral 90, is configured as a common-source HEMT 50 with a common-base HBT 52. In particular, the source electrode of the HEMT 50 is coupled to ground, as is the base electrode of the HBT 52, thus eliminating the external terminals 56 and 58, illustrated in FIG. 1b. An external load resistor $R_L$ 92 may be connected between ground and external terminal 94 to define an output load impedance at the output of the resulting 2-port HEMT common-source HBT common-base amplifier 90, as illustrated in FIG. 6.

The composite device 90, illustrated in FIG. 6, combines a common-source HEMT with a common-base HBT to form a hybrid cascode. An important aspect of this configuration is that the device can provide high input and high output impedances simultaneously. The common-source configured HEMT 50 provides optimally low noise figure performance, while the common-base configured HBT 52 provides wideband high linearity. A common advantage of any cascode configuration is that the Miller capacitance multiplication of the input device is reduced. In addition, the low loss HEMT input and HBT output characteristics of the HEMT-HBT cascode illustrated in FIG. 6 allows for the construction of low loss matching networks to tune the input HEMT 50 for noise and the output HBT 52 for linearity and power. The high input and output impedance provide optimal use of parallel feedback from the collector output of the HBT 52 to the gate input of the HEMT 50. By implementing the HBT 52 in a common-base configuration, the composite device 90 will have relatively low noise-high linearity and high frequency capability, attractive for various known high voltage gain applications.

The effective transconductance of the composite device 90 is provided by equation (13), while the input and output impedances are provided in equations (14) and (15).

$$Gm_{eff} \approx \left\{ \frac{Gm_{HEMT}}{1 + Gm_{HEMT} * r_s} \right\} * \alpha_0 \quad (13)$$

$$Z_{in}(s) \approx r_g + r_s + r_i + \frac{1}{s * C_{gs}} \quad (14)$$

$$Z_{out}(s) \approx (\beta(s) + 1) * r_0 \text{ where } \beta(s) \approx \frac{\beta_0}{1 + s/\omega_T} \quad (15)$$

An alternate configuration of the topology illustrated in FIG. 1b is shown in FIG. 7 and identified with the reference numeral 96. In this configuration the HEMT 50 is configured as a common source, thus eliminating the external terminal 56. By utilizing the base input of the HBT 52 as a third port, a HEMT-HBT 3-port composite device 96, configured as an active mixer cell, is provided; analogous to a dual-gate FET active mixer. The low noise HEMT gate input 54 is used for the receiver RF port, while the HBT base input may be used as an LO (local oscillator) input port. The HBT collector terminal 60 may be used, for example, to extract out the IF frequency.

Figure 8:
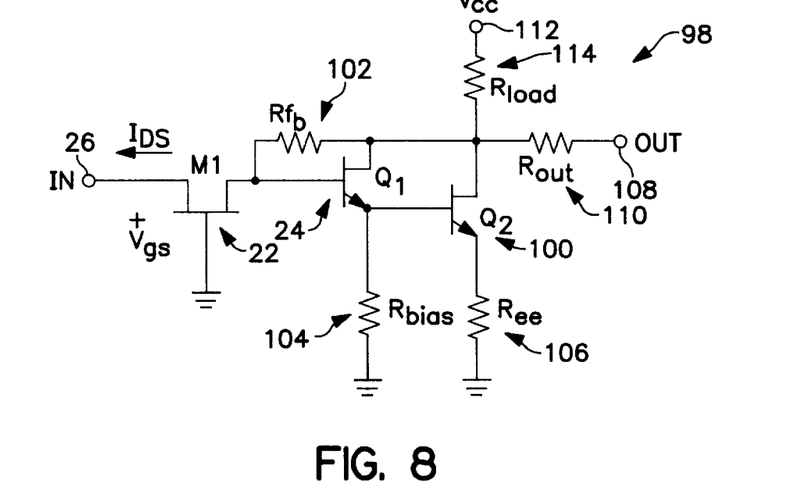
FIG. 8 is a schematic diagram of a HEMT actively matched HBT Darlington amplifier in accordance with the present invention.
Figure 12:
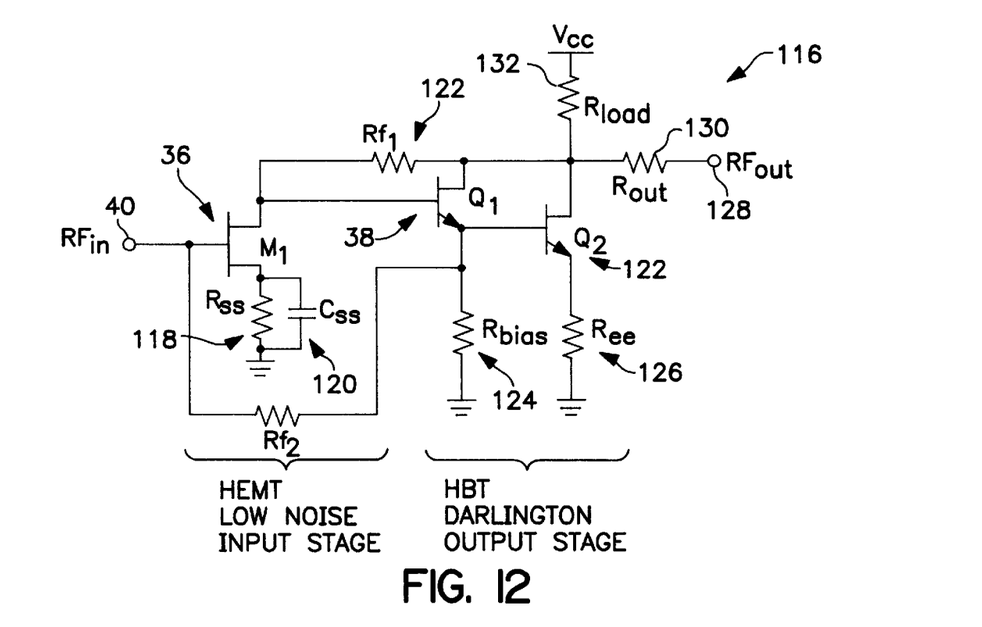
FIG. 12 is a schematic diagram of a common-source HEMT-HBT Darlington amplifier in accordance with the present invention.

Various other MMICs with useful circuit configurations can be derived from the topologies illustrated in FIG. 1. For example, a common-gate HEMT actively matched HBT Darlington feedback amplifier as illustrated in FIG. 8 can be configured from the composite topology illustrated in FIG. 1a. In addition, a HEMT-HBT low noise amplifier, as illustrated in FIG. 12, can be formed from the device topology illustrated in FIG. 1b.

Figure 9:
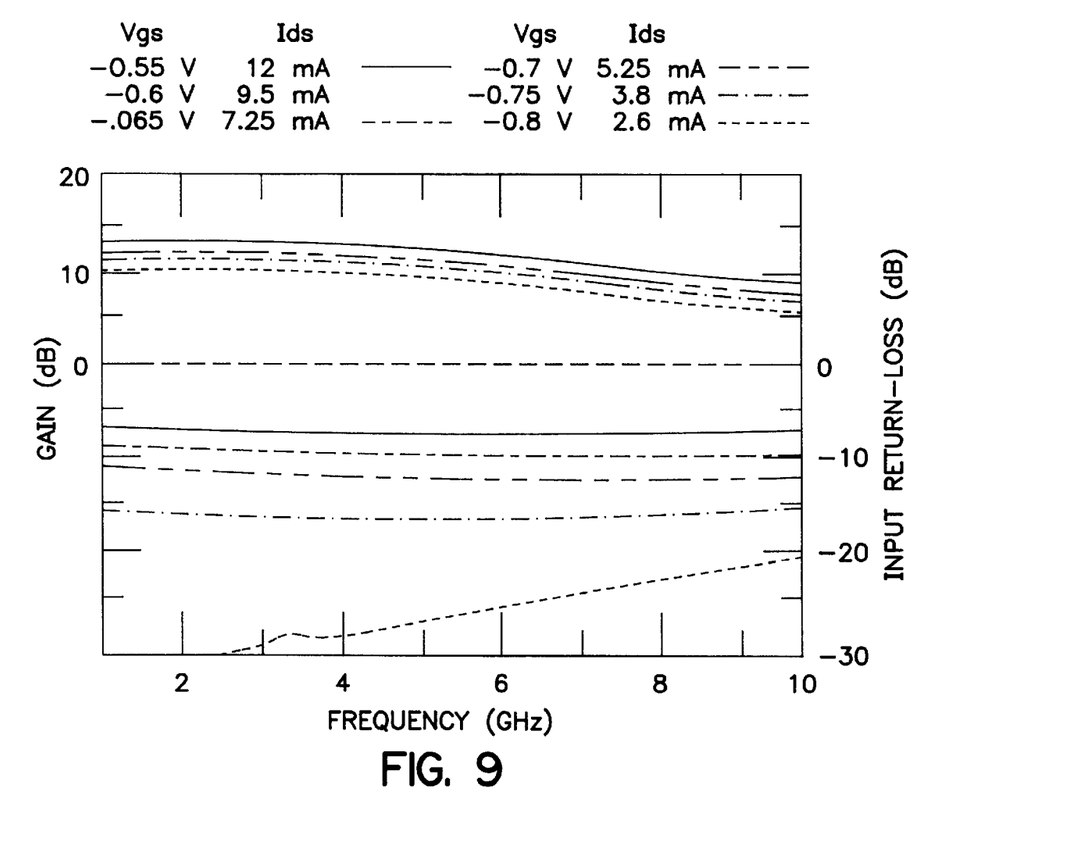
FIG. 9 is a graphical representation of the gain and input return loss of the HEMT-HBT amplifier illustrated in FIG. 8 for various HEMT biasing levels as a function of frequency.
Figure 10:
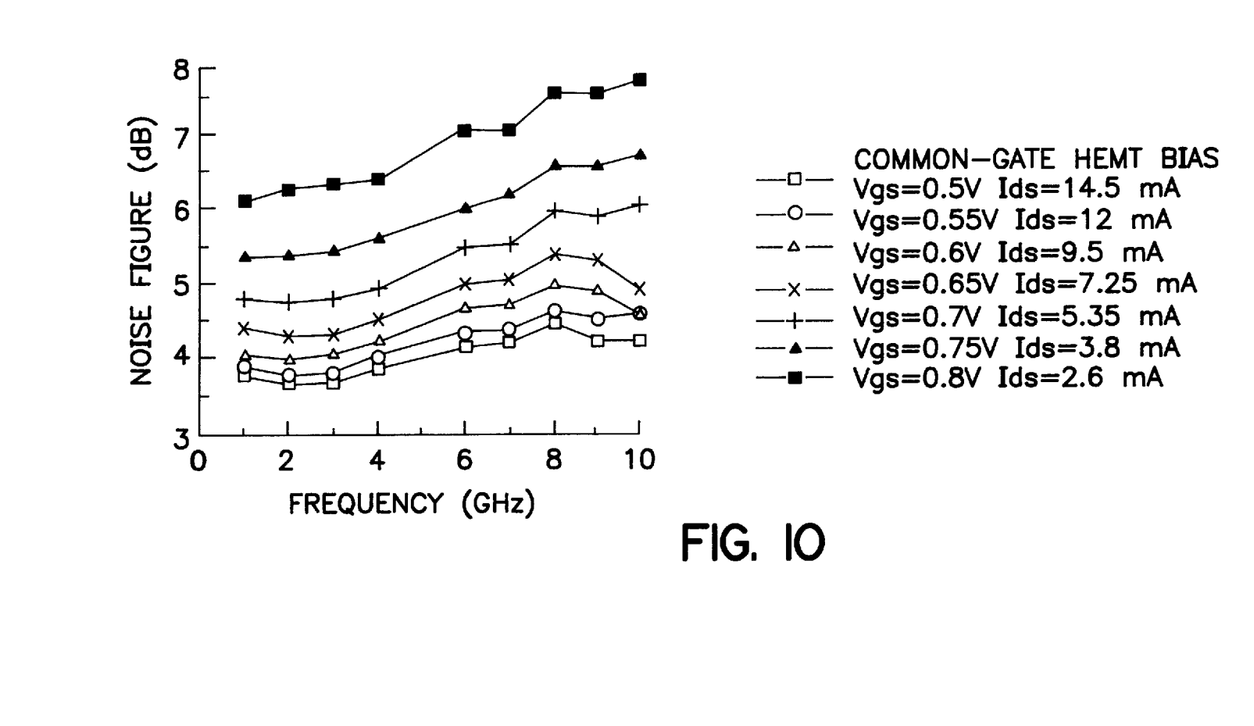
FIG. 10 is a graphical representation of the noise figure performance of the HEMT-HBT amplifier illustrated in FIG. 8 as a function of DC bias of the HEMT.
Figure 11:
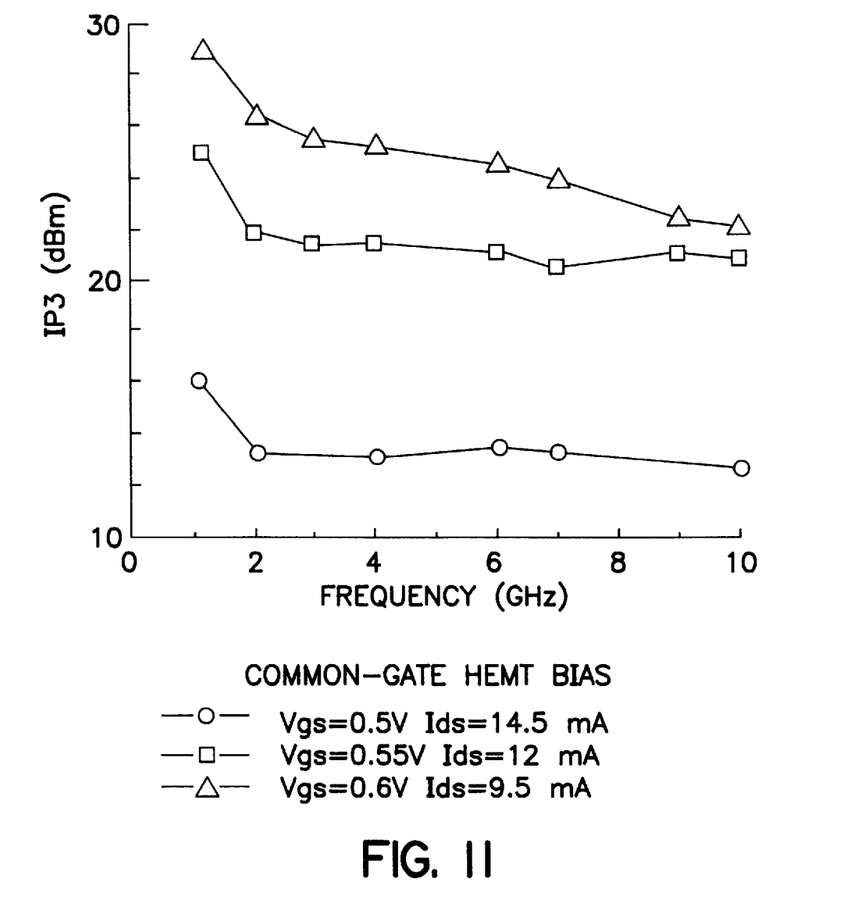
FIG. 11 is a graphical illustration of the IP3 performance of the HEMT-HBT amplifier illustrated in FIG. 8 for three different HEMT DC bias voltages.

Referring to FIG. 8, like reference numerals are used to identify components having like functions relative to FIG. 1a. The configuration illustrated in FIG. 8 is useful as a common-gate HEMT actively matched HBT Darlington feedback amplifier. The amplifier, generally identified with the reference numeral 98, includes a HEMT 22 and an HBT 24 configured in the topology as illustrated in FIG. 1a. In addition, the amplifier 98 includes a second HBT $Q_2$ 100 connected to the first HBT $Q_1$ 24 to form a Darlington pair. A feedback resistor $Rf_b$ 102 is connected between the collectors of the Darlington pair and the drain of a HEMT $M_1$ 22. A biasing resistor $R_{bias}$ 104 is connected between the base of the HBT $Q_2$ 100 and ground, while an emitter resistor $R_{ee}$ 106 is connected between the emitter terminal of the HBT $Q_2$ 100 and ground. The amplifier 98 output is available at an output terminal 108, connected to the collector electrodes of the Darlington pair HBTs $Q_1$, $Q_2$ 24, 100 by way of an output resistor $R_{out}$ 110. A third external terminal 112 is available for connection of an external power supply VCC to the circuit by way of a load resistor $R_{load}$ 114. The HEMT $M_1$ 22 is configured as a common-gate. A source terminal is connected to an external terminal 26, which forms the input of the amplifier 98. The common-gate HEMT $M_1$ 22 provides active input matching, which can be electrically tuned for optimum return loss and noise figure performance while providing relatively good RF impedance matching without the use of large, cumbersome microstrip matching components. By employing the active input match, the HBT Darlington feedback network can be independently adjusted for IP3 and gain performance without compromising the input match. As shown in FIGS. 9, 10 and 11, the amplifier 98 has a gain of >10 dB over a frequency range from dc-5 GHz; a minimum noise figure <4 dB and an IP3 as great as 29 dBm with excellent input return loss. Referring to FIG. 9, which illustrates the gain as a function of HEMT bias values at a specific bias of Vgs equal to −0.8 v and $I_{ds}$=2.6 mA, the transconductance $G_m$ of the amplifier 98 is about 20 mS, which corresponds to an input impedance of about 50Ω, calculated from equation (2) above.

FIG. 10 is a graphical illustration of the noise figure performance as a function of frequency for various active HEMT bias values. As shown, the noise figure performance is highly dependent on the active HEMT bias. For example, as shown, high bias values result in lower noise figures. However, at higher bias values the input return loss gets worse. By choosing a smaller HEMT device, both low noise figure performance, as well as good input return loss performance, can be achieved simultaneously.

FIG. 11 is a graphical illustration of the linearity or IP3 performance of the amplifier 98 as a function of frequency for various HEMT active bias conditions. As shown, the amplifier 98 has a maximum IP3 of 29 dBm at 1 GHz, which could not be achieved for the same total current consumption (DC power) using HEMT devices alone.

FIG. 12 illustrates another useful circuit configuration based on the topologies illustrated in FIG. 1. In particular, FIG. 12 is a schematic diagram of a common source HEMT-HBT Darlington low noise amplifier, generally identified with the reference numeral 116, based upon the HEMT-HBT topology illustrated in FIG. 1a. In FIG. 12 like reference numerals are used to identify components with like functions relative to FIG. 1a. The gate terminal of the HEMT $M_1$ 36 is connected to the external terminal 40, forming an RF input RFin. The HEMT $M_1$ 36 is configured as a common source HEMT. As such, the source terminal of the HEMT $M_1$ 36 is connected to ground by way of a parallel connected source resistor Rss 118 and a source capacitor $C_{ss}$ 120. A first feedback resistor $Rf_1$ 122 is connected between the collector of the HBT $Q_1$ 38 and the drain of the HEMT $M_1$ 36. A second feedback resistor $Rf_2$ is connected between the emitter of the HBT $Q_1$ 38 and the gate of the HEMT $M_1$ 36 forming a HEMT low noise input stage.

A second HBT $Q_2$ 122 is connected to the HBT $Q_1$ 38 to form a Darlington pair. A biasing resistor $R_{bias}$ 124 is connected between the base of the HBT $Q_2$ 122 and ground, while an emitter resistor $R_{ee}$ 126 is connected between the emitter terminal of the HBT $Q_2$ 122 and ground. An $RF_{out}$ terminal is available at an external terminal 128, connected to the collectors of the HBTs $Q_1$, $Q_2$ 38, 122 by way of an output resistor $R_{out}$ 130. A supply voltage $V_{cc}$ is connected to the collectors of the Darlington pair by way of a load resistor $R_{load}$ 132.

Figure 13:
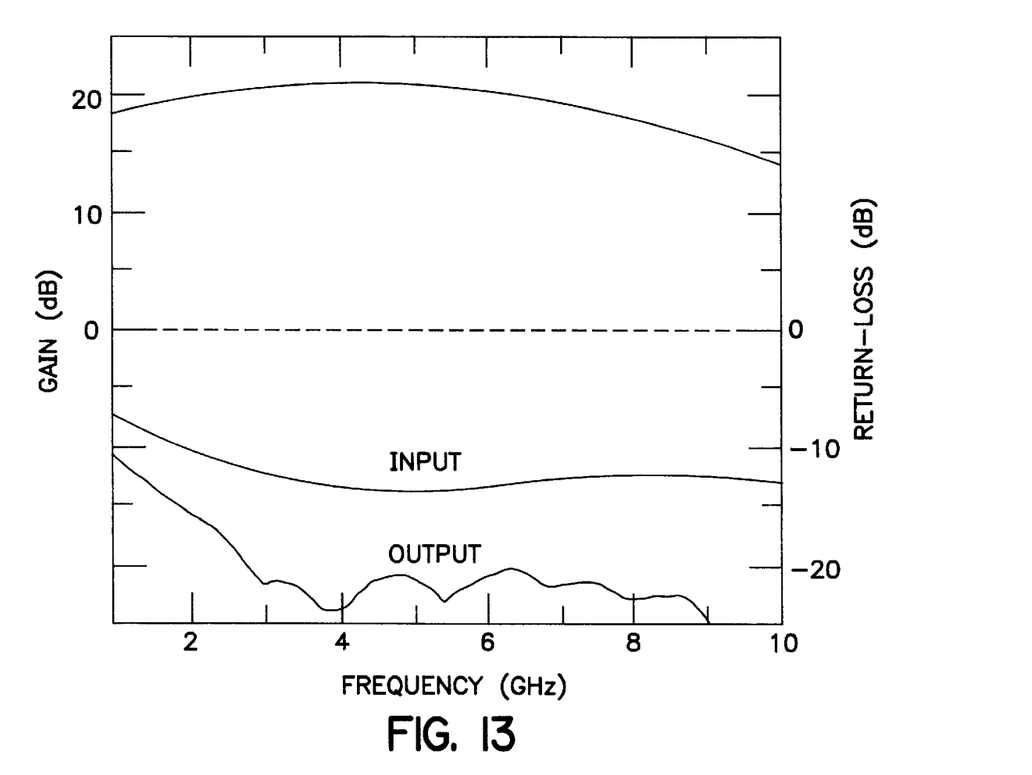
FIG. 13 is a graphical illustration of the gain and return loss performance of the HEMT-HBT amplifier illustrated in FIG. 12 as a function of frequency.
Figure 14:
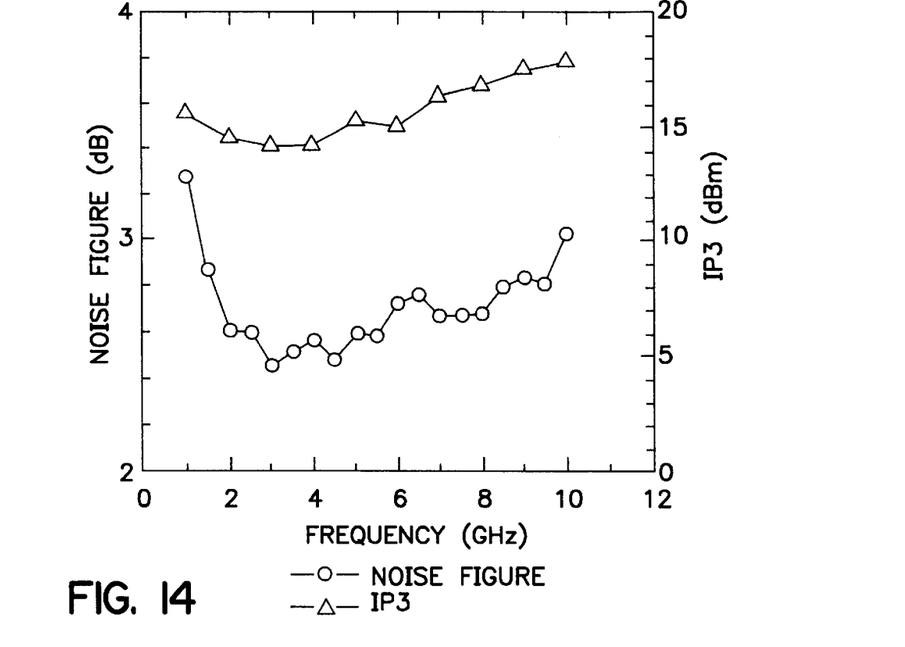
FIG. 14 is a graphical illustration of the noise figure and IP3 performance of the HEMT-HBT Darlington amplifier illustrated in FIG. 12 as a function of frequency.

The performance of the amplifier 116 is based upon a 0.2×200 $\mu m^2$ pseudomorphic InGaAs—GaAs HEMT device nominally biased to 14 mA. As shown in FIGS. 13 and 14, the HEMT $M_1$ 36 provides relatively low noise figure performance and a gain of about 10 dB to reduce the high noise figure of the HBT Darlington stage. The common source HEMT $M_1$ 36 is directly coupled to the HBT Darlington stage to accommodate self-biasing of the HEMT $M_1$ 36. The feedback resistors $Rf_1$ and $Rf_2$, load resistor $R_{load}$ and DC bias resistor $R_{ss}$ are used to set up the self-biasing of the HEMT $M_1$ 36. The Darlington stage is formed from the HBTs $Q_1$, $Q_2$ 38, 122, the Rf feedback resistor $Rf_1$, the series feedback resistor $R_{ee}$ and the bias resistor $R_{bias}$. The HBTs $Q_1$, $Q_2$ 38, 122 may be formed as 2×10 $\mu m^2$ four-finger AlGaAs—GaAs HBT devices, both biased with 13 mA of collector current. The resistor $R_{out}$ provides good output return loss match. The amplifier 116 is self-biased through the external power supply VCC, which may be 12 volts and draws about 40 mA of current.

The gain and return loss of the amplifier 116 is illustrated in FIG. 13. As shown, the amplifier 116 achieves a nominal gain of 21 dB with a bandwidth from 1–8 GHz. The input-return loss is better than 12 dB, while the output-return loss is better than 20 dB through most of the band. FIG. 14 illustrates the noise figure as well as the IP3 performance of the amplifier 116. As shown, the noise figure performance is <2.6 dB in the 2–5.5 GHz range, between 2.6 and 2.8 dB from the 6–9.5 GHz range, and 3 dB at 10 GHz. The IP3 or linearity performance is between 14–16 dBm from 1–6 GHz and then increases to about 18 dBm at 10 GHz.

Figure 15:
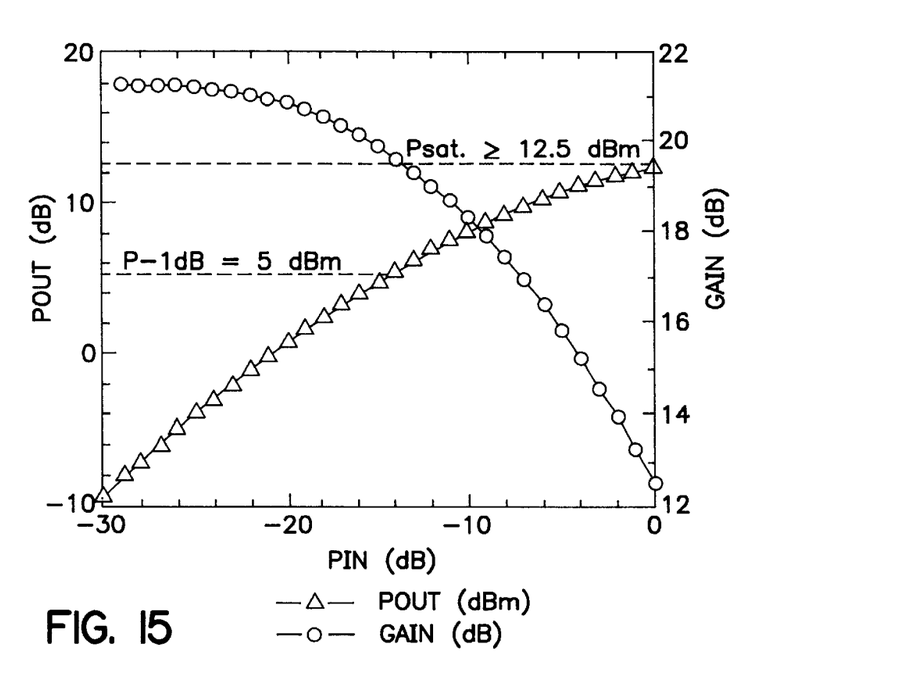
FIG. 15 is a graphical illustration of the gain and output power as a function of input power of the HEMT-HBT Darlington amplifier illustrated in FIG. 12.

FIG. 15 is a graphical illustration of the gain and output power as a function of the input power of the amplifier 116 at midband. As shown, the measured saturated output power is >12 dBm at midline. Compared to HBT single-technology Darlington amplifier, the HEMT-HBT Darlington amplifier has better performance capabilities compared to the HBT single-technology Darlington amplifier implementation which achieved 11 dB nominal gain, 10 GHz bandwidth, and 5–6.5 dB noise figure, the low noise HEMT-HBT direct coupled amplifier 116 achieves >2 dB improvement in the noise figure and a 10 dB increase in the gain without significantly compromising the bandwidth or output power capability.

Each of the devices disclosed above may be formed as a monolithic microwave integrated circuit (MMIC). As discussed above, each of the circuits may be derived from one of the topologies illustrated in FIG. 1 and includes monolithically integrated HEMTs and HBTs. The devices disclosed herein can be fabricated by known methods as disclosed in "Monolithic HEMT-HBT Integration by Selective MBE," by D. C. Streit, D. K. Umemoto, K. W. Kobayashi and A. K. Oki, *IEEE Transactions on Electron Devices*, Vol. 42, No. 4, April 1995, pp. 618–623; "A Monolithic HBT-Regulated HEMT LNA by Selective MBE," by D. C. Streit, K. W. Kobayashi, A. K. Oki and D. K. Umemoto, *Microwave and Guided Wave Letts.*, Vol. 5, No. 4, April 1995, pp. 124–126; U.S. patent application Ser. No. 08/333,538, filed on Nov. 2, 1994 all herein incorporated by reference. In addition to the HEMT-HBTs, the devices, as shown in the schematic drawings, include thin-film resistors (TFR) and metal-insulator-metal (MIM) capacitors, also known in the art. The amplifier 116, illustrated in FIG. 12, can be fabricated in an MMIC package, measuring 0.9×0.7 mm$^2$.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A monolithic microwave integrated circuit (MMIC) composite device topology comprising:
    a high electron mobility transistor (HEMT) having gate, source and drain terminal; and
    a heterojunction bipolar transistor (HBT) having base, collector and emitter terminals, wherein said base terminal is electrically connected to said drain terminal, and wherein one or more of said collector, emitter, gate and source terminals are adapted to be selectively grounded to form four or less external terminals for connection to an external circuit.

2. An MMIC topology as recited in claim 1, wherein said gate terminal of said HEMT is electrically coupled to a terminal for connection to an external circuit.

3. An MMIC topology as recited in claim 1, wherein said source terminal of said HEMT is electrically coupled to a terminal for connection to an external circuit.

4. An MMIC topology as recited in claim 1, wherein said collector terminal of said HBT is electrically coupled to a terminal for connection to an external circuit.

5. An MMIC topology as recited in claim 1, wherein said emitter terminal of said HBT is electrically coupled to a terminal for connection to an external circuit.

6. A monolithic microwave integrated circuit (MMIC) topology comprising:
    a high electron mobility transistor (HEMT) having gate, drain and source terminals; and
    a heterojunction bipolar junction transistor (HBT) having base, collector and emitter terminals, wherein said emitter terminal of said HBT is electrically coupled to said drain terminal of said HEMT, and wherein two or less of said base, collector, gate, and source terminals are adapted to be selectively grounded to form four or less external terminals for connection to an external circuit.

7. An MMIC topology as recited in claim 6, wherein said gate terminal of said HEMT is electrically coupled to a terminal for connection to an external electrical circuit.

8. An MMIC topology as recited in claim 6, wherein said source terminal of said HEMT is electrically coupled to a terminal for connection to an external circuit.

9. An MMIC topology as recited in claim 6, wherein said base terminal of said HBT is electrically coupled to a terminal for connection to an external electrical circuit.

10. An MMIC as recited in claim 6, wherein said collector terminal is electrically coupled to a terminal for connection to an external electrical circuit.

11. A monolithic microwave integrated circuit (MMIC) amplifier comprising:
    a high electron mobility transistor (HEMT) having gate, drain and source terminals, said gate terminal of said HEMT electrically coupled to ground; and
    a heterojunction bipolar transistor (HBT) having base, collector and emitter terminals, said base terminal of said HBT being electrically coupled to said drain terminal of said HEMT, said emitter terminal being electrically coupled to ground, wherein said source terminal of said HEMT and said base and collector terminals of said HBT form three external terminals for connection to an external electrical circuit, thereby forming a three terminal MMIC.

12. An MMIC as recited in claim 11, further including a first resistor, said resistor electrically coupled between said emitter terminal of said HBT and ground.

13. A monolithic microwave integrated circuit (MMIC) amplifier comprising:
    a high electron mobility transistor (HEMT) having gate, drain and source terminals, said gate terminal of said HEMT electrically coupled to ground; and
    a heterojunction bipolar transistor (HBT) having base, collector and emitter terminals, said base terminal of said HBT being electrically coupled to said drain terminal of said HEMT, said collector terminal being electrically coupled to ground, wherein said source terminal of said HEMT and said emitter and collector terminals of said HBT form three external terminals for connection to an external electrical circuit, thereby forming a three terminal MMIC.

14. A monolithic microwave integrated circuit (MMIC) amplifier comprising:
    a high electron mobility transistor (HEMT) having gate, drain and source terminals, said source terminal of said HEMT electrically coupled to ground; and
    a heterojunction bipolar transistor (HBT) having base, collector and emitter terminals, said base terminal of said HBT being electrically coupled to said drain terminal of said HEMT, said emitter terminal being electrically coupled to ground, wherein said gate terminal of said HEMT and said base and collector terminals of said HBT form three external terminals for connection to an external electrical circuit, thereby forming a three terminal MMIC.

15. An MMIC as recited in claim 14, further including a first resistor, said resistor electrically coupled between said emitter terminal of said HBT and ground.

16. A monolithic microwave integrated circuit (MMIC) amplifier comprising:
    a high electron mobility transistor (HEMT) having gate, drain and source terminals, said source terminal of said HEMT electrically coupled to ground; and
    a heterojunction bipolar transistor (HBT) having base, collector and emitter terminals, said base terminal of said HBT being electrically coupled to said drain terminal of said HEMT, wherein said gate terminal of said HEMT and said collector and emitter terminals of said HBT form three external terminals for connection to an external electrical circuit, thereby forming a three terminal MMIC.

17. A monolithic microwave integrated circuit (MMIC) amplifier comprising:
    a high electron mobility transistor (HEMT) having gate, drain and source terminals, said source terminal of said HEMT electrically coupled to ground; and
    a heterojunction bipolar transistor (HBT) having base, collector and emitter terminals, said emitter terminal of said HBT being electrically coupled to said drain terminal of said HEMT, said base terminal being electrically coupled to ground, wherein said gate and source terminals of said HEMT and said collector terminal of said HBT form three external terminals for connection to an external electrical circuit, thereby forming a three terminal MMIC.

18. A monolithic microwave integrated circuit (MMIC) mixer comprising:

a high electron mobility transistor (HEMT) having gate, drain and source terminals, said source terminal of said HEMT electrically coupled to ground; and a heterojunction bipolar transistor (HBT) having base, collector and emitter terminals, said emitter terminal of said HBT being electrically coupled to said drain terminal of said HEMT, wherein said gate terminal of said HEMT and said base and collector terminals of said HBT form three external terminals for connection to an external electrical circuit, thereby forming a three terminal MMIC mixer.

19. A monolithic microwave integrated circuit (MMIC) amplifier comprising:

a high electron mobility transistor (HEMT) having gate, drain and source terminals, said gate terminal of said HEMT electrically coupled to ground; and a first heterojunction bipolar transistor (HBT) having first base, first collector and first emitter terminals, said first base terminal of said HBT being electrically coupled to said drain terminal of said HEMT, said source terminal being electrically coupled to a terminal forming an amplifier input for connection to an external circuit;

a second HBT having base, collector and emitter terminals, said second HBT having second base, second collector and second emitter terminals, said second HBT being electrically coupled to said first HBT to form a Darlington pair;

an output terminal electrical coupled to said first and said collector terminals for connection to an external electrical circuit; and a supply terminal electrically coupled to said first and second collector terminals for connection to an external supply voltage.

20. An MMIC as recited in claim 19, further including a first resistor, electrically coupled between said first and said second collector terminals and said drain terminal of said HEMT.

21. An MMIC as recited in claim 20, further including a second resistor, electrically coupled between said second base terminal and ground.

22. An MMIC as recited in claim 21, further including a third resistor, electrically coupled between said second emitter and ground.

23. An MMIC as recited in claim 22, further including a fourth resistor, electrically coupled between said output terminal and said first and second collectors.

24. An MMIC as recited in claim 23, further including a fifth resistor, electrically coupled between said first and second collector terminals and said supply terminal.

25. A monolithic microwave integrated circuit (MMIC) comprising:

a high electron mobility transistor having gate, drain and source terminals, said source terminal being electrically coupled to ground, said gate terminal being electrically coupled to an input terminal for connection to an external circuit forming an amplifier input;

a first heterojunction bipolar transistor (HBT) having first base, first collector and first emitter terminals, said first base terminal being electrically coupled to said drain terminal of said HEMT;

a second HBT having second base, second collector and second emitter terminals, electrically coupled to said first HBT forming a Darlington pair;

an output terminal, electrically coupled to said first and second collector terminals for connection to an external circuit; and a supply terminal electrically coupled to a supply terminal for connection to an external voltage supply.

26. An MMIC as recited in claim 25, further including a first resistor, electrically coupled between said first and second collector terminals and said drain terminal of said HEMT.

27. An MMIC as recited in claim 26 further including a second resistor, electrically coupled between said second base terminal and ground.

28. An MMIC as recited in claim 27, further including a third resistor, electrically coupled between said second emitter terminal and ground.

29. An MMIC as recited in claim 28, further including a fourth resistor electrically coupled between said output terminal and said first and second collector terminals.

30. An MMIC as recited in claim 29, further including a fifth resistor, electrically coupled between said supply terminal and said first and second collector terminals.

31. An MMIC as recited in claim 30, further including a sixth resistor, electrically coupled between said source terminal and ground.

32. An MMIC as recited in claim 31, further including a capacitor, electrically coupled between said source terminal and ground.

33. An MMIC as recited in claim 32, further including a seventh resistor, electrically coupled between said first emitter terminal and said source terminal.

* * * * *